US011758693B2

(12) United States Patent
Gao

(10) Patent No.: US 11,758,693 B2
(45) Date of Patent: Sep. 12, 2023

(54) CONNECTION MODULE FOR FLUID MANAGEMENT IN LIQUID COOLED ELECTRONICS SYSTEM

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 72 days.

(21) Appl. No.: 17/359,823

(22) Filed: Jun. 28, 2021

(65) Prior Publication Data
US 2022/0418165 A1 Dec. 29, 2022

(51) Int. Cl.
*H05K 7/20* (2006.01)

(52) U.S. Cl.
CPC ..... *H05K 7/20772* (2013.01); *H05K 7/20272* (2013.01); *H05K 7/20281* (2013.01)

(58) Field of Classification Search
None
See application file for complete search history.

(56) References Cited

U.S. PATENT DOCUMENTS

| | | | | |
|---|---|---|---|---|
| 9,839,164 B2* | 12/2017 | Shelnutt | ............ | H05K 7/20772 |
| 9,961,800 B2* | 5/2018 | Jin | .................... | H05K 7/20509 |
| 10,863,652 B1* | 12/2020 | Conroy | ............. | H05K 7/20763 |
| 11,064,628 B2* | 7/2021 | Thibaut | ............. | H05K 7/20772 |
| 11,129,292 B1* | 9/2021 | Shao | .................... | H05K 7/1485 |
| 11,197,393 B2* | 12/2021 | Harvilchuck | ........ | F28F 9/0275 |
| 11,272,642 B2* | 3/2022 | Gao | ..................... | H05K 7/1488 |
| 2017/0257980 A1* | 9/2017 | Fukunaga | .............. | F16L 37/40 |
| 2018/0084676 A1* | 3/2018 | Edwards | ................ | F04D 13/12 |
| 2018/0131128 A1* | 5/2018 | Franz | ................ | H01R 13/5219 |
| 2021/0084796 A1* | 3/2021 | Gao | ..................... | H05K 7/20818 |
| 2021/0307208 A1* | 9/2021 | Shao | .................. | H05K 7/20781 |
| 2022/0110223 A1* | 4/2022 | Heydari | ............ | H05K 7/20381 |
| 2022/0151114 A1* | 5/2022 | Heydari | ............ | H05K 7/20272 |
| 2022/0287207 A1* | 9/2022 | Gao | .................... | H05K 7/20736 |

\* cited by examiner

*Primary Examiner* — Courtney L Smith
(74) *Attorney, Agent, or Firm* — WOMBLE BOND DICKINSON (US) LLP

(57) ABSTRACT

A design for servers and racks, includes a supply connector module including a supply connector connected to a first holder to connect a supply line connector, and a supply switch to engage the first holder when in a first position and to disengage with the second holder when in a second position, the second holder has a shape to disengage the supply switch and disconnect the supply connector from the supply line after a first time interval. The design further includes a return connector module a return connector connected to a second holder to connect a return line connector, and a return switch to engage the second holder when in a first position and to disengage when in a second position, the fourth holder has a shape to disengage the return switch and disconnect the return connector from the return line after a second time interval.

20 Claims, 6 Drawing Sheets

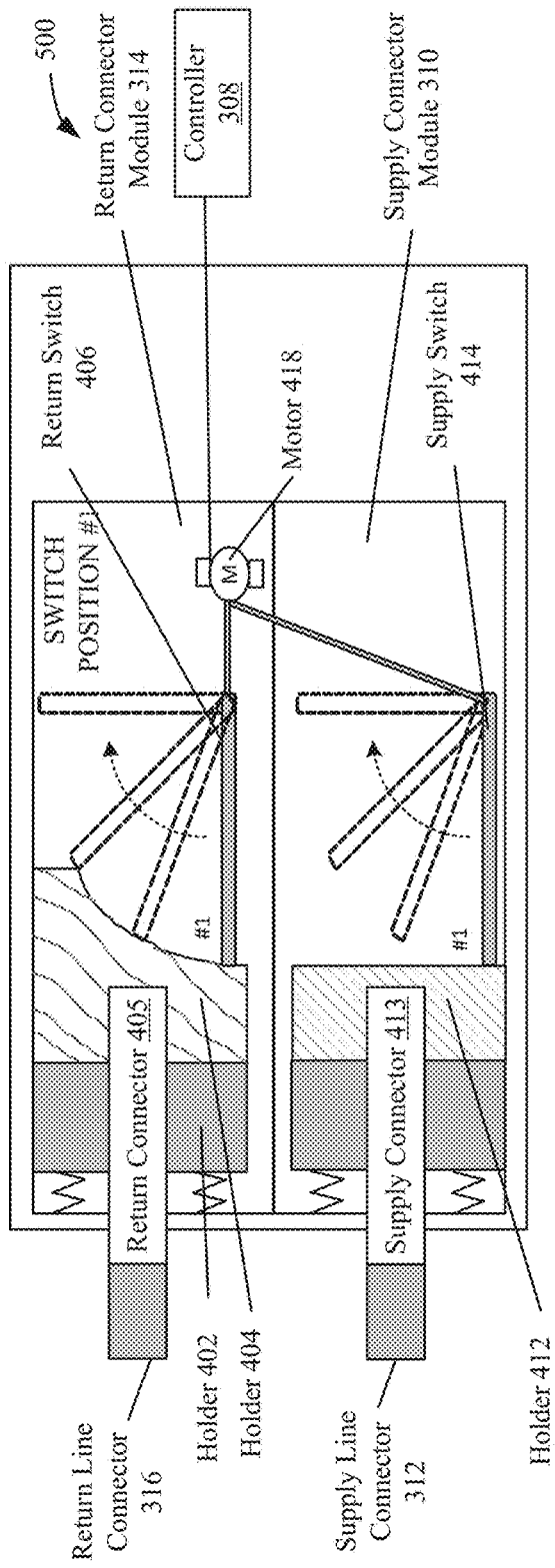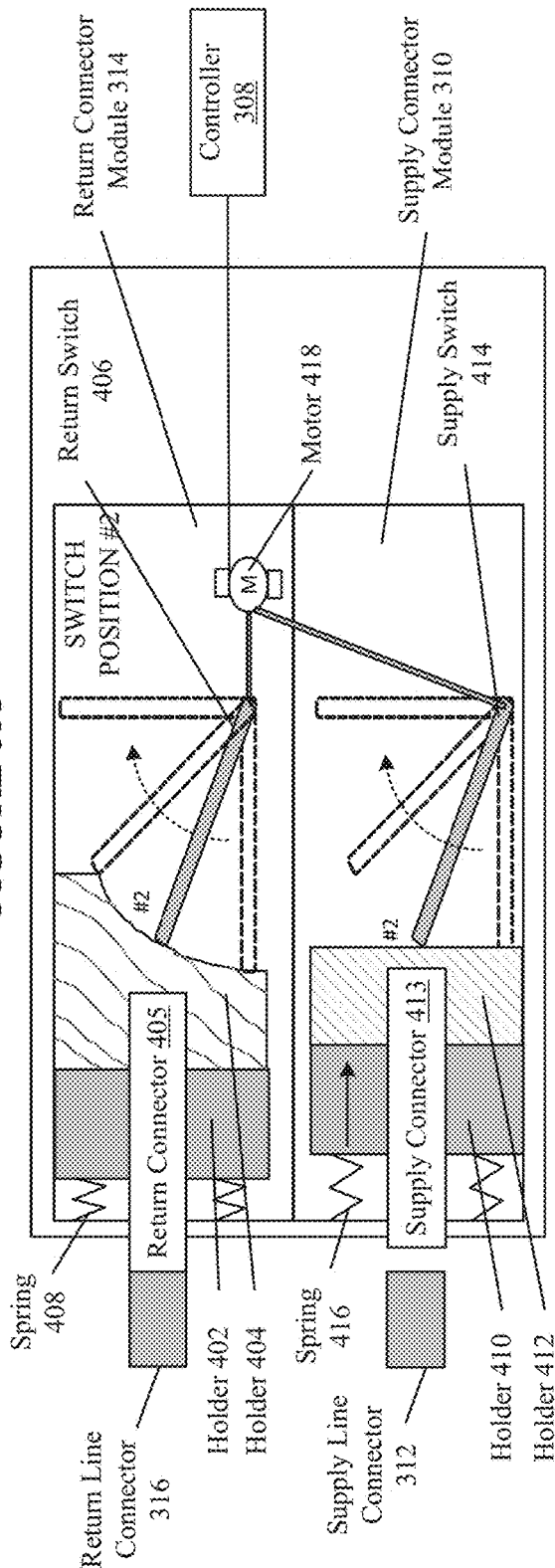

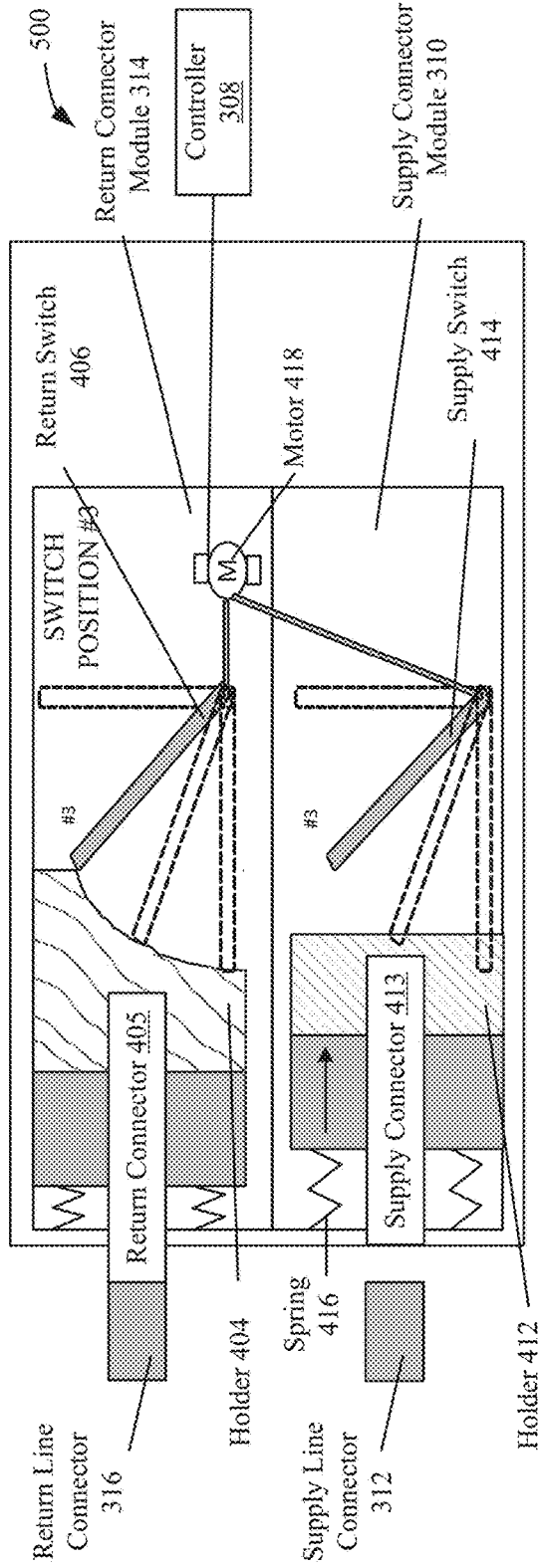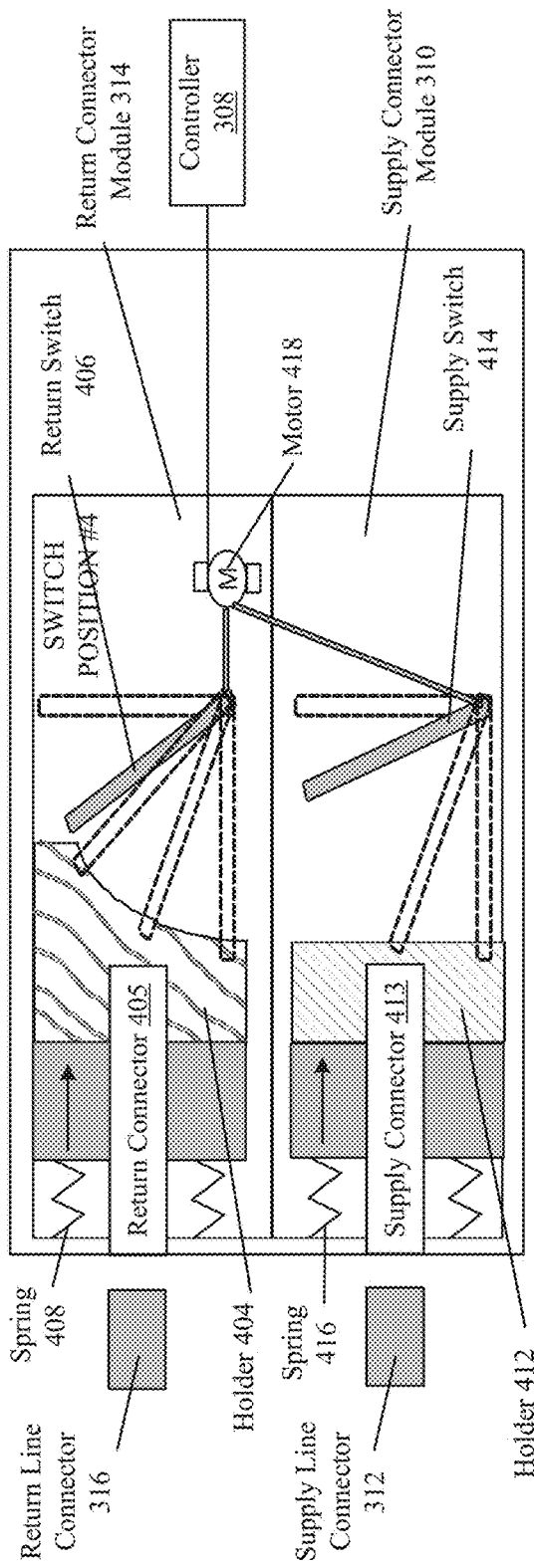
FIGURE 5C
FIGURE 5D

CONNECTION MODULE FOR FLUID MANAGEMENT IN LIQUID COOLED ELECTRONICS SYSTEM

FIELD OF THE INVENTION

Embodiments of the present invention relate generally to data center and server electronics cooling. More particularly, minimizing the impact from fluid leaks in electronic rack systems.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers. Many such system are thermally managed by liquid cooling solutions that are often superior to air cooled solutions. However, care must be taken to properly manage coolant incidents, such as leaks, to prevent damage to equipment and downtime.

BRIEF DESCRIPTION OF THE DRAWINGS

Embodiments of the invention are illustrated by way of example and not limitation in the figures of the accompanying drawings in which like references indicate similar elements.

FIGS. 5A-D are block diagrams of a rack system that illustrate four switch positions the return connector module and the supply connector module as each disconnects from the return line connector and the supply line connector, according to one embodiment.

DETAILED DESCRIPTION

Figure 1:
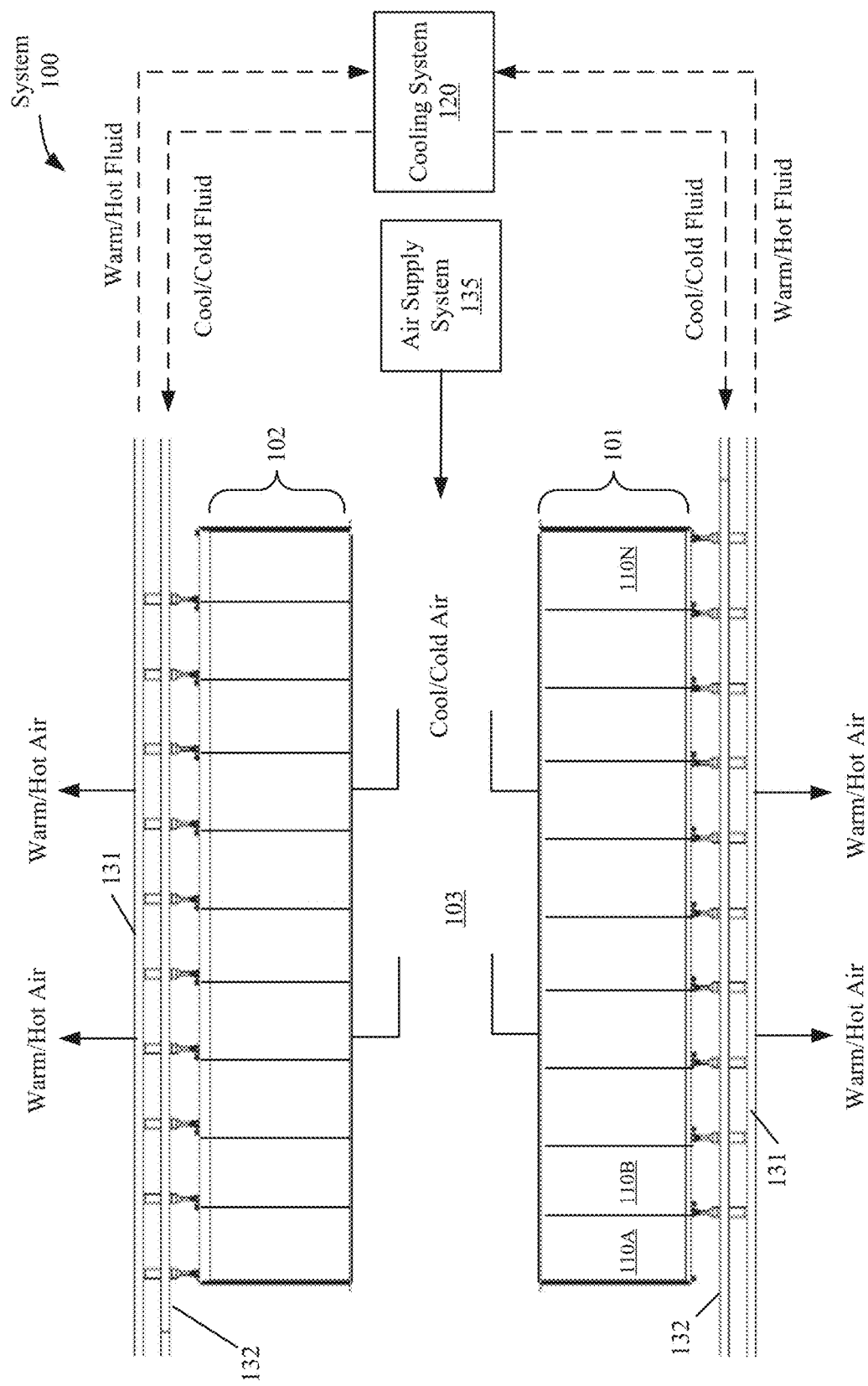
FIG. 1 is a block diagram illustrating an example of a data center or data center unit according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In one aspect, a fluid connector or connector module is connected to a manifold by a supply line including a supply line connector (also referred to as a rack supply connector), the supply line to receive cooling liquid from the cooling liquid source, and connected to the manifold by a return line including a return line connector (also referred to as a rack return connector), the return line to return warmer cooling liquid to a cooling liquid source. The fluid connector may include a supply connector module including a supply connector coupled or attached to a first holder to connect a supply line connector, and a supply switch to engage the first holder when in a first position and to disengage with the second holder when in a second position, the first holder may have a shape to disengage the supply switch and disconnect the supply connector from the supply line after a first time interval.

The system may further include a return connector module including a return connector connected or attached to a second holder to connect a return line connector, and a return switch to engage the second holder when in a first position and to disengage when in a second position, the second holder has a shape to disengage the return switch and disconnect the return connector from the return line after a second time interval that is different than the first time interval. In one embodiment, the second time interval is greater than the first time interval such that the supply connector disconnects before the return connector disconnects.

The fluid connector, in one embodiment, may further include a controller connected to a switch driver, the switch driver connected to the return switch and the supply switch, the switch driver to position the return switch and the supply switch to one of engage or disengage the second holder and the first holder, respectively. The switch driver may include an electric motor connected to the return switch and to the supply switch and configured to move the return switch to engage the second holder and to move the supply switch to engage the first holder when the electric motor is provided power. In one embodiment, a sensor may be connected to the controller, the controller may remove power to the electric motor to disengage the second holder and the first holder according to the second time interval and the first time interval, respectively, in response to a fluid leakage detected by the sensor. A pump may be connected to the controller, and the controller may increase the pump speed after the first time interval when the supply connector disconnects and signal the pump to resume normal speed after the second time interval when the return connector disconnects.

The switch driver may include a first electric motor connected to the return switch and, the first electric motor configured to move the return switch to engage the second holder when the first electric motor is provided power, and a second electric motor connected the supply switch, the second electric and configured to move the supply switch to engage the first holder when the second electric motor is provided power.

In one embodiment, the return line connector may disconnect from the return line when the second holder is disengaged after the second time interval, and the supply line connector to disconnect from the supply line when the first holder is disengaged after the first time interval. In one embodiment, the second time interval may be greater than the first time interval to disengage the first holder of the supply connector before second holder of the return connector.

In one embodiment, a return line spring may be connected to the second holder to provide a force to move the second holder away from the return line connector of the return line when the return switch is disengaged from the second holder, and a supply line spring connected to the first holder to provide a force move the first holder away from the supply line connector of the supply line when the supply switch is disengaged from the first holder. In one embodiment, the shape of the second holder to engage and disengage the return switch for the second time interval is a curve, wherein the one or more radii of the curve determines the second time interval.

According to another aspect, a sever chassis includes one or more cooling plates (e.g., cold plates) to provide liquid cooling to one or more electronic devices attached thereon (e.g., processors). The server chassis further includes a fluid connector module as described above, where the connector module is configured to connect and disconnect the cooling plates to and from a rack manifold of an electronic rack that contains the server chassis. According to a further aspect, an electronic rack includes a stack of server chassis as described above.

FIG. 1 is a block diagram illustrating an example of a data center or data center unit according to one embodiment. In this example, FIG. 1 shows a top view of at least a portion of a data center. According to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack. In various embodiments, as discussed in detail herein below, the server liquid intake connector may include a supply connector module (not shown) and the server liquid outlet connector includes a return connector module (not shown) that disengages their respective connectors from the couplings at different time intervals to prevent leaks upon disconnect. In various embodiments, the time interval may be determined by the shape of one or more connector holders within each connector module.

In one embodiment, the cooling liquid manifold disposed on the backend of each electronic rack is coupled to a supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via a return line 131 (also referred to as a room return manifold) back to cooling system 120.

Liquid return/supply lines 131-132 return/supply lines 131-132 are referred to as data center or room liquid supply/return lines (e.g., global liquid supply/return lines), which supply cooling liquid to all of the electronic racks of rows 101-102. The supply line 132 and return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow supply system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
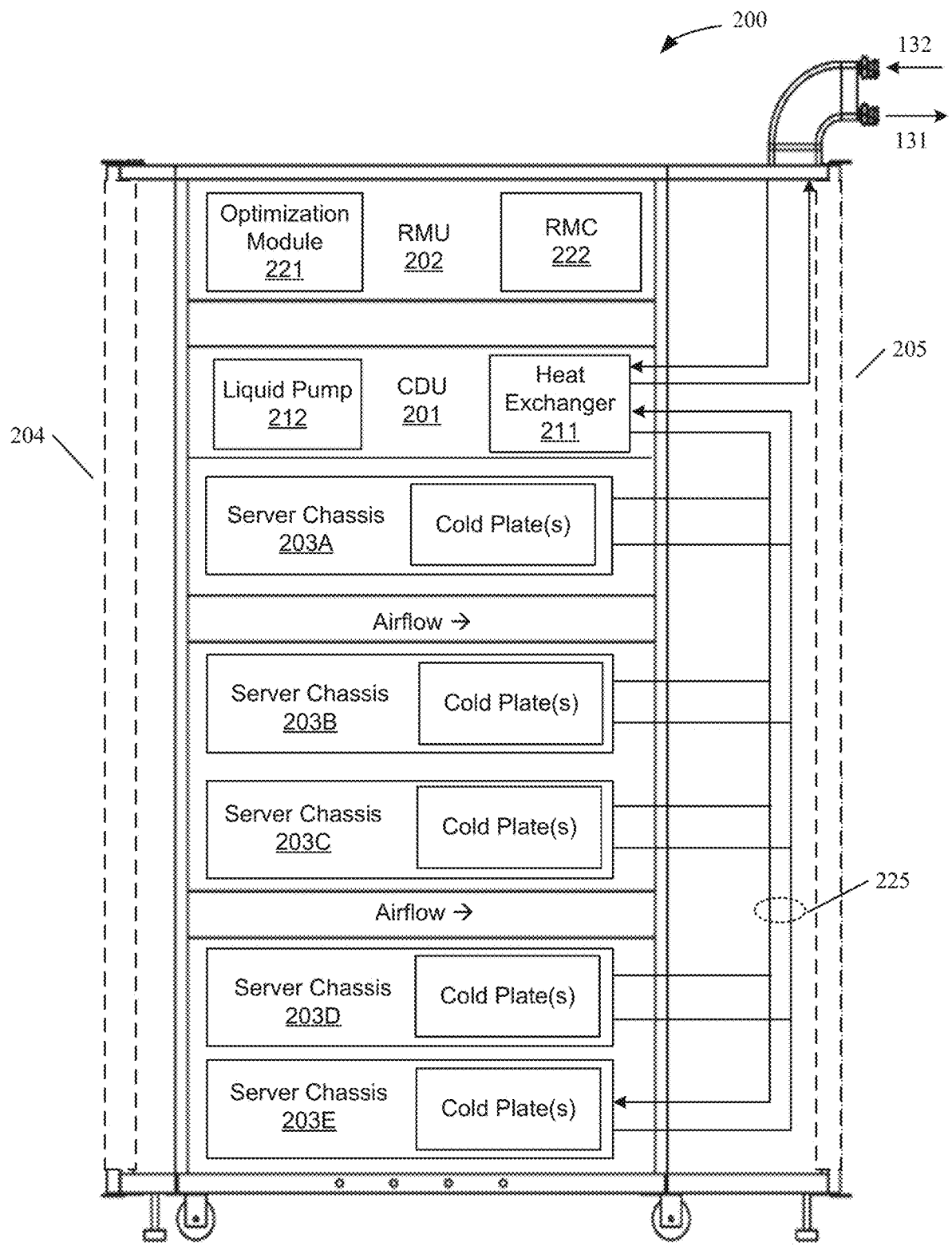
FIG. 2 is block diagram illustrating an electronic rack according to one embodiment.

FIG. 2 is block diagram illustrating an electronic rack according to one embodiment. Electronic rack 200 may represent any of the electronic racks as described throughout this application. According to one embodiment, electronic rack 200 includes, but is not limited to, coolant distribution unit (CDU) 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid return/supply lines 131-132 to form a primary loop. The connectors coupled to the external liquid return/supply lines 131-132 may be disposed or mounted on backend 205 of electronic rack 200. The liquid return/supply lines 131-132, also referred to as room liquid supply/return lines, may be coupled to an external cooling system.

In various embodiments, as discussed in detail herein below, each server chassis may include a server liquid intake connector that further includes a supply connector module (not shown) and a server liquid outlet connector that includes a return connector module (not shown) that disengages their respective connectors from the couplings at different time intervals to prevent leaks upon disconnect. In various embodiments, the time interval may be determined by the shape of one or more connector holders within each connector module.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to server chassis 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for the fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures the liquid pump 212 and cooling fans of the fan modules based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown is described for the purpose of illustration only; other configurations or arrangements may also be applicable. For example, CDU 201 may be an optional unit. The cold plates of server chassis 203 may be coupled to a rack manifold, which may be directly coupled to room manifolds without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
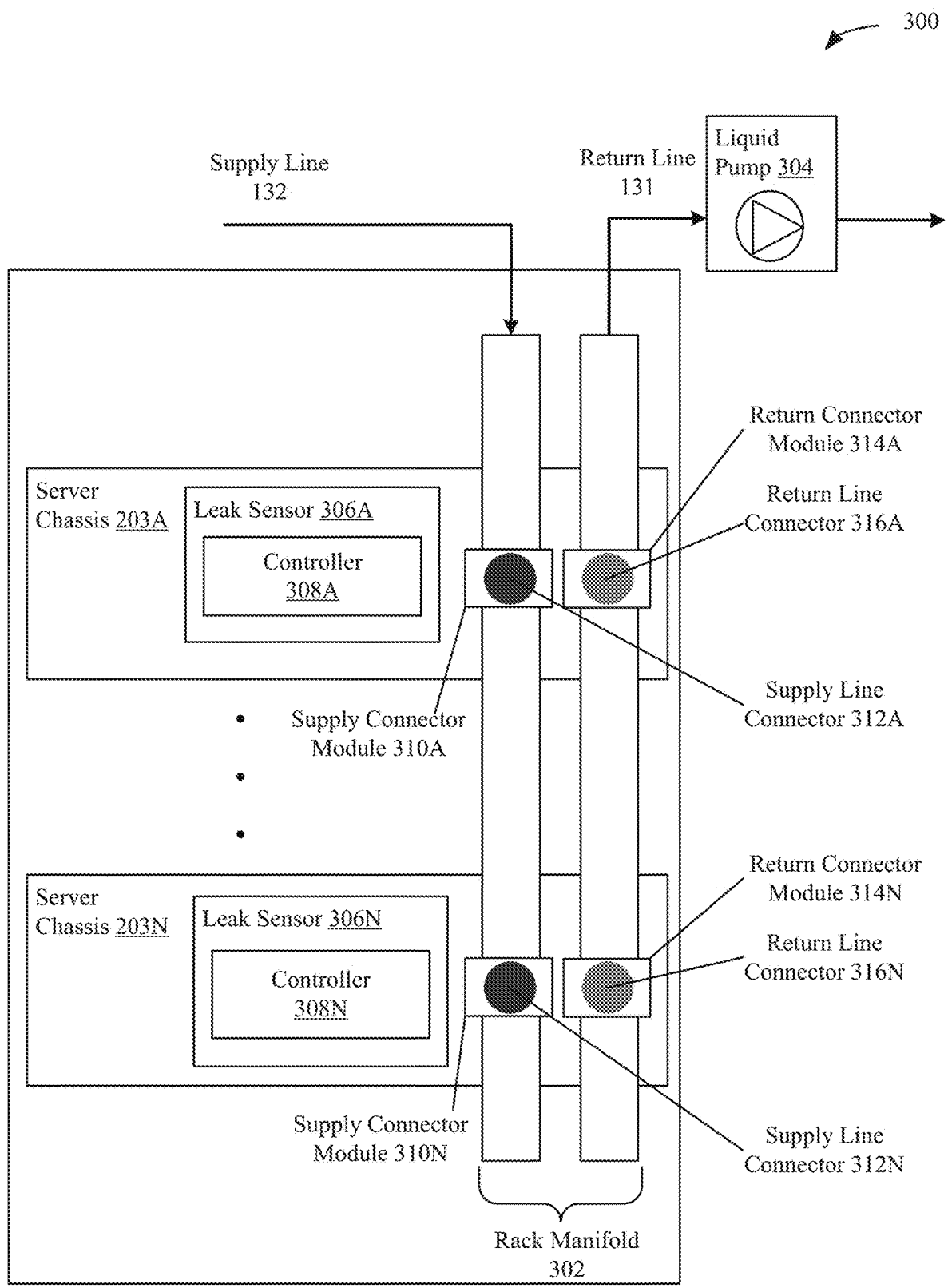
FIG. 3 is block diagram illustrating an electronic rack that disengages its connectors to manage a cooling liquid leak in the electronic rack.

FIG. 3 is block diagram illustrating an electronic rack 300 that disengages its connectors to manage a cooling liquid leak in the electronic rack. The electronic rack 300 may be included in any of the electronic rack embodiments as described in this application, such as electronic rack 200 of FIG. 2. According to one embodiment, electronic rack 300, in a rear view in this example, includes one or more server chassis connected to a rack manifold 302, for simplicity only two server chassis are illustrated, server chassis 203A and server chassis 203N. Each server chassis 203A and 203N include a leak sensor 306A and 306N, and controller 308A and controller 308N, respectively. In one embodiment, the supply line 132 is connected to the rack manifold 302, which is connected to each server chassis 203A and 203N through supply connector module 310A and 310N through supply line connector 312A and supply line connector 312N, respectively. A supply line connector is also referred to as a rack supply connector.

Similarly, the return line 131 is connected to the rack manifold 302, which may be connected to each server chassis 203A and 203N through return connector module 314A and 314N through return line connector 316A and return line connector 316N, respectively. A return line connector is also referred to as a rack return connector. In various embodiments, the supply line and return line connectors may be of any type that may be disengaged by their respective connector modules, such as blind mating connectors and the like.

In one embodiment, a liquid pump 304 is connected to the return line 131 and may be controlled by a controller, such as controller 308A of server chassis 203A. For example, to manage a leakage incident the leak sensor 306A and the controller 308A may work together to signal the supply connector module 310A and the return connector module 314A to disconnect from the supply line connector 312A and the return line connector 316A. In one embodiment, the supply line connector 312A and the return line connector 316A are disengaged according to different time intervals. For example, the supply line connector 312A may be disengaged and disconnected first, and at some later time interval the return line connector 316A may be disengaged and disconnected to allow the liquid pump 304 to clear the liquid coolant from server chassis 203A and prevent leakage that may damage components within the electronic rack 300. In various embodiments, the disengagement time interval may be dependent upon various component configurations within the supply connector module 310A and return connector module 314A, as discussed in further detail below with respect to FIGS. 4 and 5. In one embodiment, the controller 308A may vary the pump speed (e.g., increase the pump speed) for a time during the disengagement and disconnect process, for example, after the supply line connector 312A is disconnected and before the return line connector 314A is disconnected, or some variation around the disengagement time interval.

Figure 4:
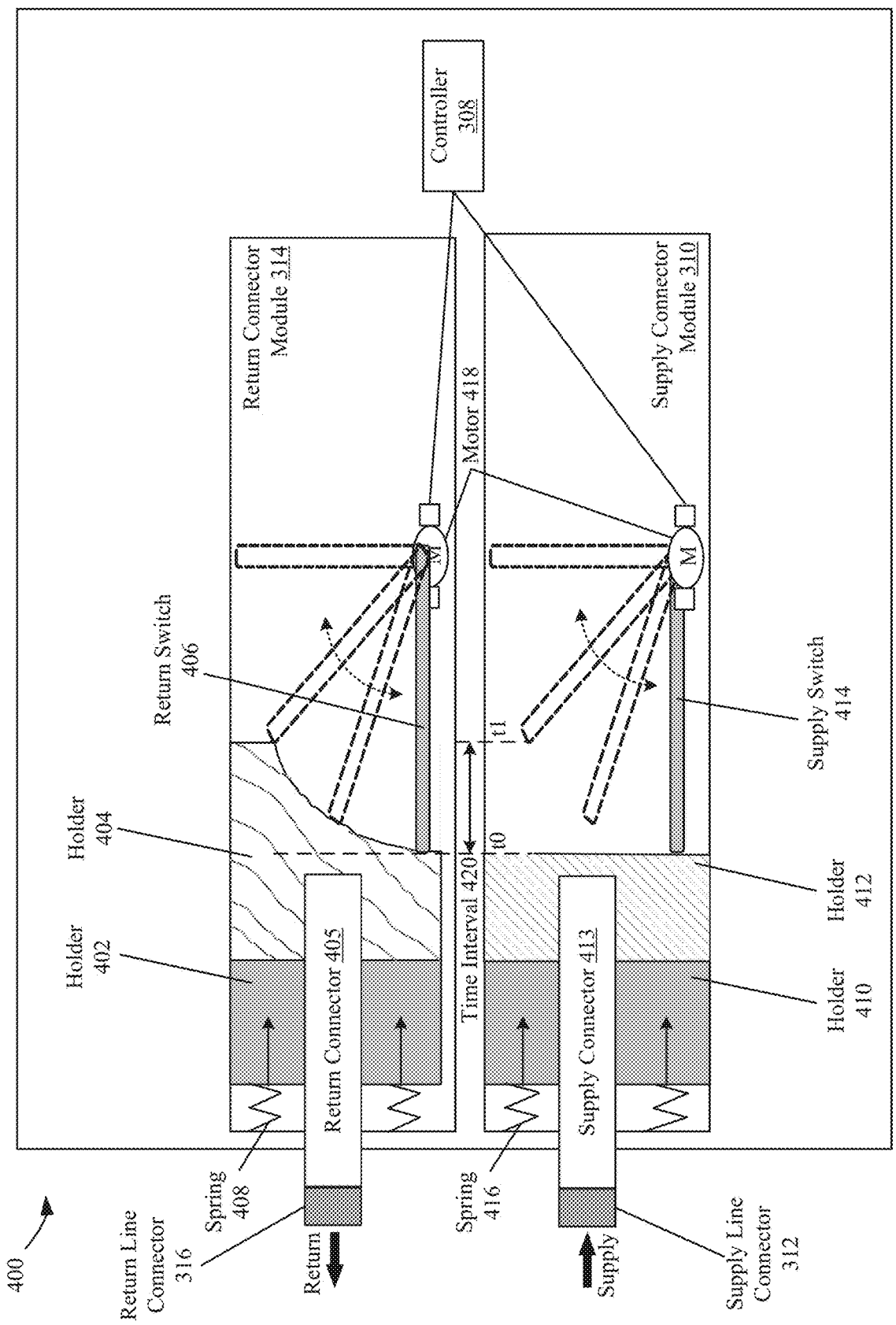
FIG. 4 is block diagram illustrating a server chassis, according to one embodiment, to disengage its connectors to manage a cooling liquid leak.

FIG. 4 is block diagram illustrating a server chassis 400, according to one embodiment, to disengage its connectors to manage a cooling liquid leak. Server chassis 400 includes the return connector module 314, the return line connector or rack return connector 316, the supply connector module 310, the supply line connector or rack supply connector 312, and the controller 308 as described with respect to FIG. 3. The return connector module 314 includes a holder 402, a holder 404, a return connector 405, a return switch 406, and a spring 408. Note that holders 402 and 404 may be integrated as a single holder (e.g., a second holder). The supply connector module 310 includes a holder 410, a holder 412, a supply connector 413, a supply switch 414, and a spring 416. Similarly, holders 410 and 412 may be integrated as a single holder (e.g., a first holder). In various embodiments, the return connector module 314 and the supply connector module 310 may various configurations of holders. For example, instead of two holders (e.g., holder 402 and holder 404) there may be one holder or three or more holders. In an embodiment, 402 and 404 can be combined as one unit. 402 is mainly for holding the connector, and 404 is mainly for functioning with the switch.

The return switch 406 and the supply switch 414 are connected to a switch driver, such as a motor 418, to engage and disengage with the holder 404 and the holder 412, respectively. In one embodiment, the holder 404 is in contact with holder 402 that is under tension from spring 408, and similarly, the holder 412 is contact with holder 410 that is under tension from spring 416. The return connector 405 and the supply connector 413, in one embodiment, may move together with their respective holders (e.g., holder 402 and 404) to engage or release the return line connector 316 and supply line connector 312 based on the position of the return switch 406 and the supply switch 414, respectively.

As discussed with respect to FIG. 3, in one embodiment, the controller 308 may send a signal to motor 418 that results in the return switch 406 and supply switch 414 clockwise to disengage the return connector 405 and the supply connector 413 from their respective line connectors, return line connector 316 and supply line connector 312. In one embodiment, the signal from the controller 308 shuts off the motor 418 and each switch (e.g., supply switch 414 and return switch 406) may be under tension or force to rotate clockwise, for example, by a spring (not shown) connected to the switch. In another embodiment, the motor 418 may actively under power rotate each switch to engage and disengage with their respective holders.

To prevent leakage from cooling liquid remaining in the system the return connector 405 disengages after the supply connector 413 to provide a time interval for the pump (not shown) to clear the system. In one embodiment, the time interval, such as time interval 420 that includes t0 and t1, may be determined by the shape of the holder 404 of the return connector module 314. As shown in this embodiment, the holder 404 has a curved shape such that it disengages from the return switch 406 starting at time interval t0 and continues to full disengagement at time interval t1. The supply switch begins disengaging from the holder 412 at time interval t0 and thus disconnects the supply connector 413 at the time interval 420 before the return switch 406.

Although the holder 404 is illustrated as having a curved or parabolic shape and radii in this embodiment, in other embodiments, the shape may be any shape that creates a time interval 420 between the disengagement of each switch with its respective holder to disconnect each connector. In one embodiment, the holder 404 and the holder 412 may be configurable in place or removable and replaced by another holder to lessen or increase the time interval 420. Additionally, in another embodiment, the holder 412 may also have a shape similar to that of the holder 404 but still create a time interval 420 such that the return connector 405 is disconnected after the supply connector 413. In other embodiments, the motor 418 may be a single electric motor connected to each switch or it may be an individual electric motors connected to each switch but controlled by the controller 308 as described herein.

FIGS. 5A-D are block diagrams of a rack system 500 that illustrate four switch positions the return connector module 314 and the supply connector module 310 as each disconnects from the return line connector 316 and the supply line connector 312, according to one embodiment. Beginning at FIG. 5A, in one embodiment, the motor 418 is powered on and the return switch 406 and the supply switch 414 are held at switch position #1, fully engaged with holder 404 and holder 412, respectively, to engage the return connector 405 to connect to the return line connector 316 and the supply connector 413 to the supply line connector 312. FIG. 5B illustrates an embodiment when the controller 308 signals the motor 418 to power off, at which point the return switch 406 and the supply switch 414 begin to rotate clockwise, as shown in switch position #2. The return switch 406 is still engaged with the holder 402 and the holder 404 based on its shape, and the return connector 405 remains connected to the return line connector 316. The supply switch 414 at switch position #2 has started to disengage with the holder 412 and the spring 416 has forced the holders 410 and 412 along with the connector 413 away from the supply line connector 312.

FIG. 5C illustrates the return switch 406 and the supply switch 414 at switch position #3. The return switch 406 has reached the end of the holder 404 and begins to disengage from the holder 404. The supply switch 414 at switch position #3 has disengaged with the holder 412 and the spring 416 has fully extended and the connector 413 has detached fully from the supply line connector 312. In one embodiment, the controller 308 may signal the liquid pump (e.g., liquid pump 304) to increase pump speed to expedite pumping the excess coolant fluid from the system to prevent leakage. FIG. 5D illustrates the return switch 406 and the supply switch 414 at switch position #4. The return switch 406 has fully disengaged from the holder 404 and the spring 408 has forced the holders 402 and 404 along with the connector 405 away from the return line connector 316 and thus disconnecting the return line connector 316 from the return connector 405. In one embodiment, the controller 308 may signal the liquid pump (e.g., liquid pump 304) to return to normal speed when the return connector 405 disconnects from the return line connector 316.

In the foregoing specification, embodiments of the invention have been described with reference to specific exemplary embodiments thereof. It will be evident that various modifications may be made thereto without departing from the broader spirit and scope of the invention as set forth in the following claims. While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

What is claimed is:

1. A fluid connector apparatus, comprising:
a supply connector module coupled to a controller, the supply connector module comprising:
a supply connector attached to a first holder, wherein the supply connector is configured to connect with a rack supply connector of a rack manifold of an electronic rack, and to supply cooling fluid received from the rack manifold to one or more cooling plates of one or more server chassis, and
a supply switch configured to engage with the first holder when in a first position and to disengage with the first holder when in a second position, the first holder comprising a first shape configured, in response to a disconnect operation signaled by the controller, to disengage the supply switch and disconnect the supply connector from the rack supply connector after a first time interval; and
a return connector module coupled to the controller, the return connect module comprising:
a return connector attached to a second holder, wherein the return connector is configured to connect with a rack return connector of the rack manifold, and to return the cooling fluid received from the one or more cooling plates to the rack manifold, and
a return switch configured to engage with the second holder when in the first position and to disengage with the second holder when in the second position, the second holder comprising a second shape configured, in response to the disconnect operation signaled by the controller, to disengage the return switch and disconnect the return connector from the rack return connector after a second time interval, wherein the second time interval is different than the first time interval.

2. The fluid connector apparatus of claim 1, wherein the controller is coupled to a switch driver and the switch driver is coupled to the return switch and the supply switch, the switch driver configured to position the return switch and the supply switch configured to one of engage or disengage the second holder and the first holder, respectively.

3. The fluid connector apparatus of claim 2, wherein the switch driver comprises an electric motor coupled to the return switch and to the supply switch and configured to move the return switch to engage the second holder and to move the supply switch to engage the first holder when the electric motor is provided power.

4. The fluid connector apparatus of claim 3, further comprising a sensor coupled to the controller, the controller configured to remove power to the electric motor to disengage the second holder and the first holder according to the second time interval and the first time interval, respectively, in response to a fluid leakage detected by the sensor, wherein the second time interval is greater than the first time interval.

5. The fluid connector apparatus of claim 4, further comprising a pump coupled to the controller, the controller configured to increase a pump speed of the pump after the first time interval and signal the pump to resume a normal speed after the second time interval.

6. The fluid connector apparatus of claim 2, wherein the switch driver comprises:
   a first electric motor coupled to the supply switch and, the first electric motor configured to move the supply switch to engage the first holder when the first electric motor is provided power; and
   a second electric motor coupled the return switch, the second electric and configured to move the return switch to engage the second holder when the second electric motor is provided power.

7. The fluid connector apparatus of claim 1, further comprising:
   a first spring configured to provide force to push the supply connector away from the rack supply connector when the first holder is disengaged after the first time interval; and
   a second spring configured to provide force to push the return connector away from the rack return connector when the second holder is disengaged after the second time interval.

8. The fluid connector apparatus of claim 1, wherein the first shape of the first holder and the second shape of the second holder are configurable to determine the first time interval and the second time interval, respectively.

9. The fluid connector apparatus of claim 1, wherein the second shape of the second holder is configured to engage and disengage the return switch for the second time interval comprises a curve shape, wherein one or more radii of the curve shape determines the second time interval.

10. A server chassis of an electronic rack, comprising:
    one or more cooling plates to provide liquid cooling to one or more electronic devices attached thereon;
    a supply connector module coupled to the one or more cooling plates and coupled to a controller, the supply connector module comprising:
       a supply connector attached to a first holder, wherein the supply connector is configured to connect with a rack supply connector of a rack manifold of an electronic rack, and to supply cooling fluid received from the rack manifold to the one or more cooling plates, and
       a supply switch configured to engage with the first holder when in a first position and to disengage with the first holder when in a second position, the first holder comprising a first shape configured, in response to a disconnect operation signaled by the controller, to disengage the supply switch and disconnect the supply connector from the rack supply connector after a first time interval; and
    a return connector module coupled to the one or more cooling plates and coupled to the controller, the return connector module comprising:
       a return connector attached to a second holder, wherein the return connector is configured to connect with a rack return connector of the rack manifold, and to return the cooling fluid received from the one or more cooling plates to the rack manifold, and
       a return switch configured to engage with the second holder when in the first position and to disengage with the second holder when in the second position, the second holder comprising a second shape configured, in response to the disconnect operation signaled by the controller, to disengage the return switch and disconnect the return connector from the rack return connector after a second time interval, wherein the second time interval is different than the first time interval.

11. The server chassis of claim 10, wherein the controller is coupled to a switch driver and the switch driver is coupled to the return switch and the supply switch, the switch driver configured to position the return switch and the supply switch to one of engage or disengage the second holder and the first holder, respectively.

12. The server chassis of claim 11, wherein the switch driver comprises an electric motor coupled to the return switch and to the supply switch and configured to move the return switch to engage the second holder and to move the supply switch to engage the first holder when the electric motor is provided power.

13. The server chassis of claim 12, further comprising a sensor coupled to the controller, the controller configured to remove power to the electric motor to disengage the second holder and the first holder according to the second time interval and the first time interval, respectively, in response to a fluid leakage detected by the sensor, wherein the second time interval is greater than the first time interval.

14. The server chassis of claim 13, further comprising a pump coupled to the controller, the controller configured to increase a pump speed of the pump after the first time interval and signal the pump to resume a normal speed after the second time interval.

15. The server chassis of claim 11, wherein the switch driver comprises:
    a first electric motor coupled to the supply switch and, the first electric motor configured to move the supply switch to engage the first holder when the first electric motor is provided power; and
    a second electric motor coupled the return switch, the second electric and configured to move the return switch to engage the second holder when the second electric motor is provided power.

16. The server chassis of claim 10, wherein:
    the supply connector module further comprises a first spring configured to provide force to push the supply connector away from the rack supply connector when the first holder is disengaged after the first time interval; and
    the return connector module further comprises a second spring configured to provide force to push the return connector away from the rack return connector when the second holder is disengaged after the second time interval.

17. The server chassis of claim 10, wherein the first shape of the first holder and the second shape of the second holder are configurable to determine the first time interval and the second time interval, respectively.

18. The server chassis of claim 10, wherein the second shape of the second holder is configured to engage and disengage the return switch for the second time interval comprises a curve shape, wherein one or more radii of the curve shape determines the second time interval.

19. An electronic rack of a data center, comprising:
   a rack manifold having a plurality of pairs of rack supply connectors and rack return connectors; and
   a plurality of server chassis arranged in a stack, each of the server chassis comprises:
      one or more cooling plates to provide liquid cooling to one or more electronic devices attached thereon;
      a supply connector module coupled to the one or more cooling plates and coupled to a controller, the supply connector module comprising:
         a supply connector attached to a first holder, wherein the supply connector is configured to connect with a rack supply connector of the rack manifold, and to supply cooling fluid received from the rack manifold to the one or more cooling plates, and
         a supply switch configured to engage with the first holder when in a first position and to disengage with the first holder when in a second position, the first holder comprising a first shape configured, in response to a disconnect operation signaled by the controller, to disengage the supply switch and disconnect the supply connector from the rack supply connector after a first time interval; and
      a return connector module coupled to the one or more cooling plates and coupled to the controller, the return connector module comprising:
         a return connector attached to a second holder, wherein the return connector is configured to connect with a rack return connector of the rack manifold, and to return the cooling fluid received from the one or more cooling plates to the rack manifold, and
         a return switch configured to engage with the second holder when in the first position and to disengage with the second holder when in the second position, the second holder comprising a second shape configured, in response to the disconnect operation signaled by the controller, to disengage the return switch and disconnect the return connector from the rack return connector after a second time interval, wherein the second time interval is different than the first time interval.

20. The electronic rack of claim 19, wherein each of the server chassis further comprises a switch driver coupled to the controller, the switch driver coupled to the return switch and the supply switch, the switch driver configured to position the return switch and the supply switch to one of engage or disengage the second holder and the first holder, respectively.

* * * * *